(12) United States Patent
Yang et al.

(10) Patent No.: US 10,658,614 B2
(45) Date of Patent: May 19, 2020

(54) METHOD OF ENCAPSULATING A FLEXIBLE OLED PANEL AND ENCAPSULATION STRUCTURE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Zhongguo Yang, Guangdong (CN); Jinchuan Li, Guangdong (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 359 days.

(21) Appl. No.: 15/580,139

(22) PCT Filed: Nov. 27, 2017

(86) PCT No.: PCT/CN2017/113006
§ 371 (c)(1),
(2) Date: Dec. 6, 2017

(87) PCT Pub. No.: WO2019/075853
PCT Pub. Date: Apr. 25, 2019

(65) Prior Publication Data
US 2020/0028115 A1    Jan. 23, 2020

(30) Foreign Application Priority Data
Oct. 17, 2017 (CN) .......................... 2017 1 0964820

(51) Int. Cl.
*H01L 51/52* (2006.01)
*H01L 27/32* (2006.01)
(Continued)

(52) U.S. Cl.
CPC ...... *H01L 51/5253* (2013.01); *H01L 27/3244* (2013.01); *H01L 51/0097* (2013.01); *H01L 51/56* (2013.01)

(58) Field of Classification Search
CPC . H01L 51/5253; H01L 27/3244; H01L 51/56; H01L 51/0097
See application file for complete search history.

(56) References Cited

U.S. PATENT DOCUMENTS 8,366,505 B2 * 2/2013 Yeh .................... H01L 51/5256
313/512
2018/0076413 A1 * 3/2018 Li ......................... H01L 51/56

FOREIGN PATENT DOCUMENTS

| CN | 104538420 | 4/2015 |
| CN | 105097881 | 11/2015 |

(Continued)

*Primary Examiner* — Karen Kusumakar
(74) *Attorney, Agent, or Firm* — Hemisphere Law, PLLC; Zhigang Ma

(57) ABSTRACT

The embodiments of the disclosure provide a method of encapsulating a flexible OLED panel and an encapsulation structure of a flexible OLED panel. The method of encapsulating a flexible OLED panel includes: forming a liquid metal layer on a first inorganic barrier layer covering the OLED device; using oxygen to oxidize the liquid metal layer, and forming a liquid metal oxide layer on a surface of the liquid metal layer; and sequentially forming an organic buffer layer and a second inorganic barrier layer on the liquid metal oxide layer to obtain an encapsulation structure. The first inorganic barrier layer, the second inorganic barrier layer, the liquid metal layer and the liquid metal oxide layer could prevent penetration of water and oxygen, and the liquid metal layer and the organic buffer layer could release the interlayer stress of the encapsulation structure in order to keep the flexibility of the encapsulation structure.

11 Claims, 3 Drawing Sheets

(51) Int. Cl.
*H01L 51/00* (2006.01)
*H01L 51/56* (2006.01)

(56) References Cited

FOREIGN PATENT DOCUMENTS

| | | | |
|---|---|---|---|
| CN | 106784405 | | 5/2017 |
| CN | 107248550 | | 10/2017 |
| TW | 201025695 A | | 7/2010 |
| WO | WO 2009139292 | | 11/2009 |
| WO | WO2017/016156 | * | 2/2017 |

* cited by examiner

METHOD OF ENCAPSULATING A FLEXIBLE OLED PANEL AND ENCAPSULATION STRUCTURE

RELATED APPLICATIONS

The present application is a National Phase of International Application Number PCT/CN2017/113006, filed on Nov. 27, 2017, and claims the priority of China Application 201710964820.6, filed on Oct. 17, 2017.

FIELD OF THE DISCLOSURE

The disclosure relates to the technical field of display device, and particularly to a method of encapsulating a flexible OLED panel and an encapsulation structure.

BACKGROUND

The Organic Light Emitting Display (OLED) possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device.

The OLED can be categorized into two major types according to the driving methods, which are the Passive Matrix OLED (PMOLED) and the Active Matrix OLED (AMOLED), i.e. two types of the direct addressing and the Thin Film Transistor (TFT) matrix addressing. The AMOLED comprises pixels arranged in array and belongs to active display type, which has high lighting efficiency and is generally utilized for the large scale display devices of high resolution.

OLED display technologies, which is different from LCD display technologies, apply very thin organic material coating and glass substrate, and then these organic materials illuminate without backlight while current pass. However, due to organic material's easy reaction with water and oxygen, as being display equipment of organic material, the criteria of encapsulating of OLED display is very high. In order to cast commercial of OLED display, relative encapsulating technologies become research spotlight.

Currently, the encapsulating of the OLED device is using the encapsulating glue to encapsulate the solid substrate (such as glass or metal), but this method is not suitable for flexible device. Therefore, there is technical solution that using the stack films to encapsulate the OLED device, the method is generally forming two inorganic barrier layers with the capability of preventing penetration of water and oxygen on the OLED device, and forming an organic buffer layer with the flexibility between the two inorganic barrier layers. The inorganic barrier layer is used for preventing penetration of water and oxygen outside the OLED device, and the organic buffer layer is used for releasing the interlayer stress, so the encapsulation structure could apply on the flexible device. However, the organic buffer layer is not compact enough to prevent penetration of water and oxygen, so the capability of preventing penetration of water and oxygen of the encapsulation structure is restricted.

Indium and the alloy of indium are new material in recent years and have some unique properties such as low permeability of water and oxygen, low melting point, good plasticity, and good flexibility, so indium and the alloy of indium have wild application in electronic industry. Wherein, the binary eutectic alloy (low melting point eutectic alloy) consisted of indium and gallium has a compact degree similar to the solid metal, so the capability of preventing penetration of water and oxygen is good and the state at room temperature is liquid. When the binary eutectic alloy consisted of indium and gallium is exposed in the air, the surface will react with the oxygen in the air to form an oxide film. The oxide film is very compact and has good capability of preventing penetration of water and oxygen, so the inside of the material could be prevented from oxidation in order to keep the liquid state and the flexibility.

SUMMARY

The purpose of the disclosure is to provide a method of encapsulating a flexible OLED panel to enhance the capability of preventing penetration of water and oxygen and the flexibility, so the encapsulation effect of the flexible OLED panel could be improved.

The other purpose of the disclosure is to provide an encapsulation structure of a flexible OLED panel with good capability of preventing penetration of water and oxygen and good flexibility, so the encapsulation effect of the flexible OLED panel could be improved.

To achieve the above object, according to one aspect, the embodiment of the disclosure provides a method of encapsulating a flexible OLED panel, including the following steps:

step S1: providing a TFT substrate, and manufacturing an OLED device on the TFT substrate;

step S2: forming a first inorganic barrier layer covering the OLED device on the TFT substrate;

step S3: forming a liquid metal layer on the first inorganic barrier layer;

step S4: using oxygen to oxidize the liquid metal layer, and forming a liquid metal oxide layer on a surface of the liquid metal layer;

step S5: forming an organic buffer layer covering the liquid metal oxide layer on the first inorganic barrier layer; and step S6: forming a second inorganic barrier layer covering the organic buffer layer on the first inorganic barrier layer.

In one embodiment, wherein the TFT substrate includes a flexible TFT substrate.

In one embodiment, wherein wherein a material of the liquid metal layer includes a binary eutectic alloy consisted of indium and gallium.

In one embodiment, wherein a mass ratio of indium to gallium of the binary eutectic alloy is 1:3.

In one embodiment, wherein the first inorganic barrier layer is formed via plasma enhanced chemical vapor deposition in the step S2, the liquid metal layer is formed via ink jet printing in a nitrogen environment in the step S3, the organic buffer layer is formed via ink jet printing in the step S5 and further includes a step of curing the organic buffer layer after the step S5, the second inorganic barrier layer is formed via plasma enhanced chemical vapor deposition in the step S6, an area covered by the second inorganic barrier layer is the same as an area covered by the first inorganic barrier layer, and the first inorganic barrier layer and the second inorganic barrier layer include silicon nitride, silicon oxide, or silicon oxynitride.

According to another aspect, the embodiment of the disclosure provides an encapsulation structure of a flexible OLED panel, including:

a TFT substrate;

an OLED device, disposed on the TFT substrate;

a first inorganic barrier layer, disposed on the TFT substrate and covering the OLED device;

a liquid metal layer, disposed on the first inorganic barrier layer;

a liquid metal oxide layer, covering a surface of the liquid metal layer;

an organic buffer layer, disposed on the first inorganic barrier layer and covering the liquid metal oxide layer and a second inorganic barrier layer, disposed on the first inorganic barrier layer and covering the organic buffer layer.

In one embodiment, wherein the TFT substrate includes a flexible TFT substrate.

In one embodiment, wherein a material of the liquid metal layer includes a binary eutectic alloy consisted of indium and gallium.

In one embodiment, wherein a mass ratio of indium to gallium of the binary eutectic alloy is 1:3.

In one embodiment, wherein an area covered by the second inorganic barrier layer is the same as an area covered by the first inorganic barrier layer, and the first inorganic barrier layer and the second inorganic barrier layer include silicon nitride, silicon oxide, or silicon oxynitride.

Furthermore, according to another aspect, the embodiment of the disclosure provides a method of encapsulating a flexible OLED panel, including the following steps:

step S1: providing a TFT substrate, and manufacturing an OLED device on the TFT substrate;

step S2: forming a first inorganic barrier layer covering the OLED device on the TFT substrate;

step S3: forming a liquid metal layer on the first inorganic barrier layer;

step S4: using oxygen to oxidize the liquid metal layer, and forming a liquid metal oxide layer on a surface of the liquid metal layer;

step S5: forming an organic buffer layer covering the liquid metal oxide layer on the first inorganic barrier layer; and step S6: forming a second inorganic barrier layer covering the organic buffer layer on the first inorganic barrier layer;

wherein the TFT substrate includes a flexible TFT substrate;

wherein a material of the liquid metal layer includes a binary eutectic alloy consisted of indium and gallium;

wherein a mass ratio of indium to gallium of the binary eutectic alloy is 1:3; and wherein the first inorganic barrier layer is formed via plasma enhanced chemical vapor deposition in the step S2, the liquid metal layer is formed via ink jet printing in a nitrogen environment in the step S3, the organic buffer layer is formed via ink jet printing in the step S5 and further includes a step of curing the organic buffer layer after the step S5, the second inorganic barrier layer is formed via plasma enhanced chemical vapor deposition in the step S6, an area covered by the second inorganic barrier layer is the same as an area covered by the first inorganic barrier layer, and the first inorganic barrier layer and the second inorganic barrier layer include silicon nitride, silicon oxide, or silicon oxynitride.

By applying the technical solution according to the embodiment of the disclosure, the method of encapsulating a flexible OLED panel includes: forming a liquid metal layer on a first inorganic barrier layer covering the OLED device; using oxygen to oxidize the liquid metal layer, and forming a liquid metal oxide layer on a surface of the liquid metal layer; and sequentially forming an organic buffer layer and a second inorganic barrier layer on the liquid metal oxide layer to obtain an encapsulation structure. The first inorganic barrier layer, the second inorganic barrier layer, the liquid metal layer and the liquid metal oxide layer could prevent penetration of water and oxygen, and the liquid metal layer and the organic buffer layer could release the interlayer stress of the encapsulation structure in order to keep the flexibility of the encapsulation structure and enhance the capability of preventing penetration of water and oxygen, so the encapsulation effect of the flexible OLED panel could be improved.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

The disclosure will be further described in detail with reference to accompanying drawings and preferred embodiments as follows.

Figure 1:
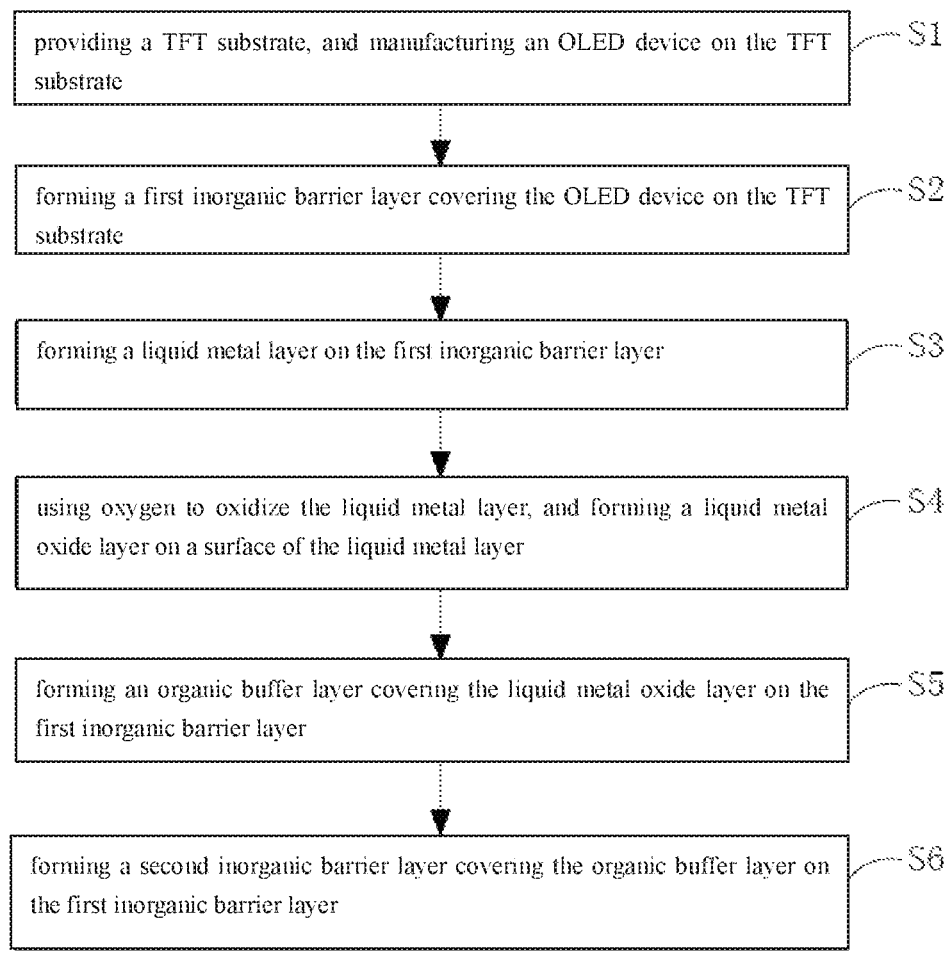
FIG. 1 is a flow chart diagram of a method of encapsulating a flexible OLED panel according to an embodiment of the disclosure.
Figure 2:
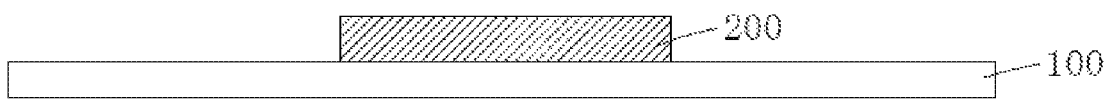
FIG. 2 is a structural schematic view of the step S1 of the method of encapsulating a flexible OLED panel according to an embodiment of the disclosure.

As FIG. 1 shown, is a flow chart diagram of a method of encapsulating a flexible OLED panel according to an embodiment of the disclosure. In this embodiment, the method of encapsulating a flexible OLED panel includes the following steps:

Step S1: please refer to FIG. 2, providing a TFT substrate 100, and manufacturing an OLED device 200 on the TFT substrate 100.

Specifically, the TFT substrate 100 includes a flexible TFT substrate.

Figure 3:
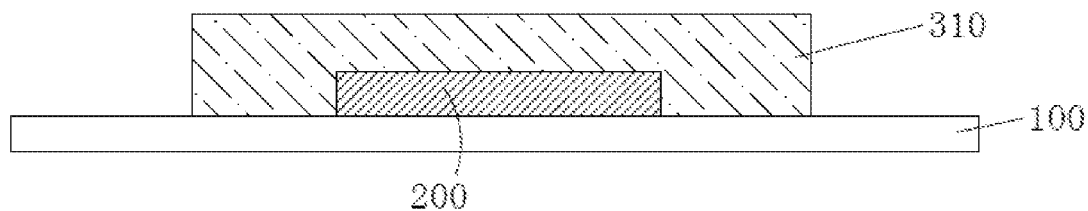
FIG. 3 is a structural schematic view of the step S2 of the method of encapsulating a flexible OLED panel according to an embodiment of the disclosure.

Step S2: please refer to FIG. 3, forming a first inorganic barrier layer 310 covering the OLED device 200 on the TFT substrate 100.

Specifically, the first inorganic barrier layer 310 includes silicon nitride ($SiN_x$), silicon oxide ($SiO_x$), or silicon oxynitride ($SiO_xN_y$).

Specifically, the first inorganic barrier layer 310 is formed via plasma enhanced chemical vapor deposition (PECVD) in the step S2

Figure 4:
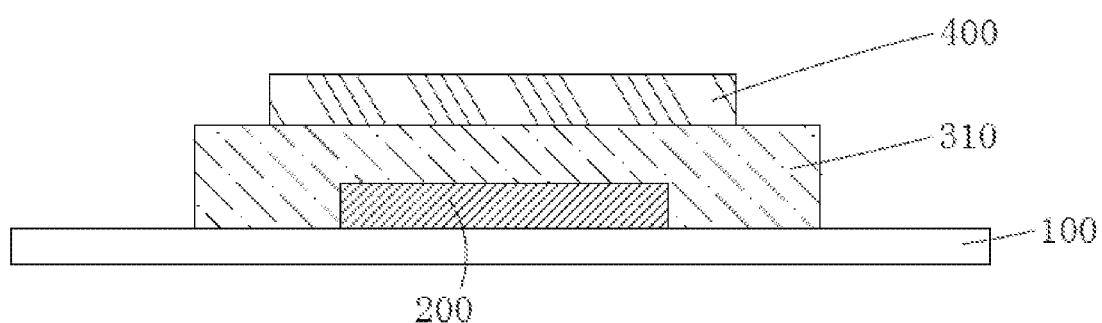
FIG. 4 is a structural schematic view of the step S3 of the method of encapsulating a flexible OLED panel according to an embodiment of the disclosure.

Step S3: please refer to FIG. 4, forming a liquid metal layer 400 on the first inorganic barrier layer 310, the size of an area covered by the liquid metal layer 400 is smaller than the size of an area covered by the first inorganic barrier layer 310.

Specifically, a material of the liquid metal layer 400 includes a binary eutectic alloy consisted of indium and gallium. The liquid metal layer 400 has a compact degree similar to the solid metal, so the capability of preventing penetration of water and oxygen is good. The state of the liquid metal layer 400 at room temperature is liquid, so the flexibility is good.

Selectively, a mass ratio of indium to gallium of the binary eutectic alloy is 1:3.

Specifically, the liquid metal layer 400 is formed via ink jet printing in a nitrogen ($N_2$) environment in the step S3.

Figure 5:
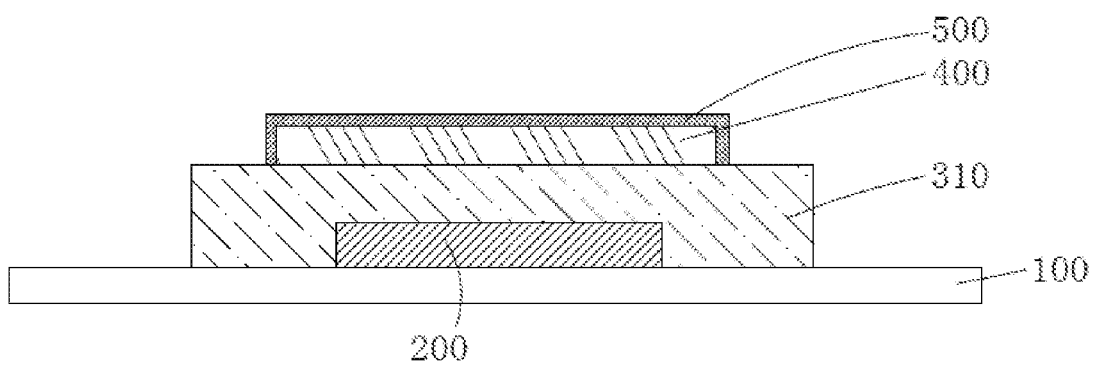
FIG. 5 is a structural schematic view of the step S4 of the method of encapsulating a flexible OLED panel according to an embodiment of the disclosure.

Step S4: please refer to FIG. 5, using oxygen to oxidize the liquid metal layer 400, and forming a liquid metal oxide layer 500 on a surface of the liquid metal layer 400. The liquid metal oxide layer 500 is very compact and has good capability of preventing penetration of water and oxygen, so the liquid metal layer 400 inside the liquid metal oxide layer 500 could be prevented from oxidation in order to keep the liquid state and the flexibility.

Figure 6:
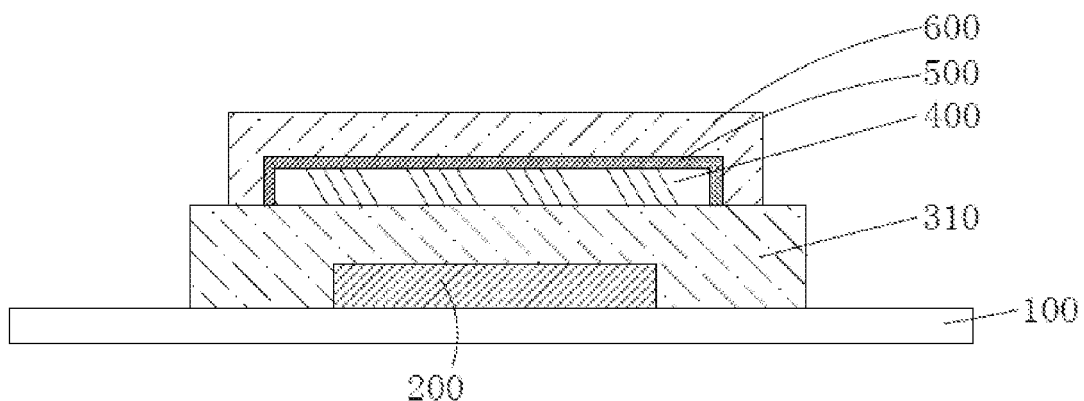
FIG. 6 is a structural schematic view of the step S5 of the method of encapsulating a flexible OLED panel according to an embodiment of the disclosure.

Step S5: please refer to FIG. 6, forming an organic buffer layer 600 covering the liquid metal oxide layer 500 on the first inorganic barrier layer 310, the size of an area covered by the organic buffer layer 600 is smaller than the size of the area covered by the first inorganic barrier layer 310, and due to the organic buffer layer 600 covers the liquid metal oxide layer 500, so the size of an area covered by the organic buffer layer 600 is larger than the size of an area covered by the liquid metal oxide layer 500.

Specifically, the organic buffer layer 600 is formed via ink jet printing in the step S5.

Specifically, after the step S5, the method of encapsulating a flexible OLED panel further includes a step of curing the organic buffer layer 600.

Figure 7:
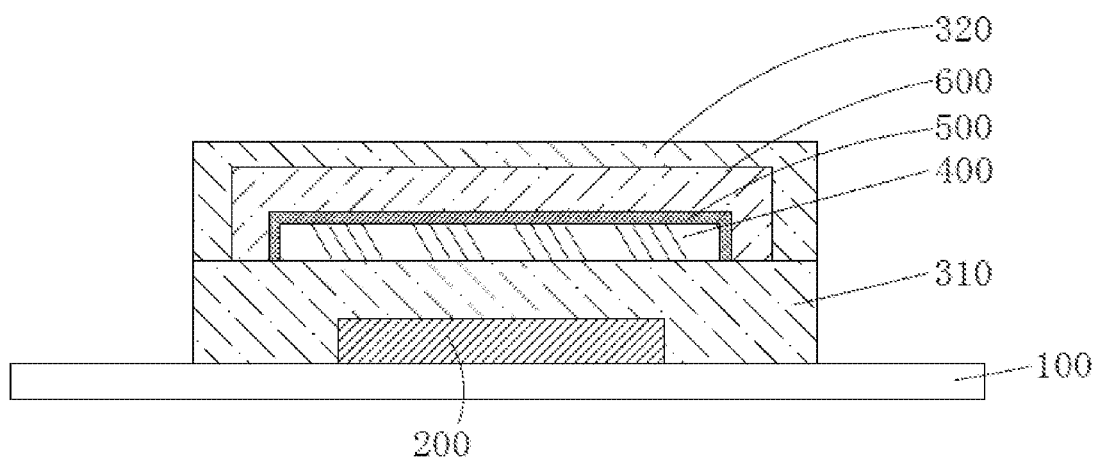
FIG. 7 is a structural schematic view of the step S6 of the method of encapsulating a flexible OLED panel and an encapsulation structure of a flexible OLED panel according to an embodiment of the disclosure.

Step S6: please refer to FIG. 7, forming a second inorganic barrier layer 320 covering the organic buffer layer 600 on the first inorganic barrier layer 310.

Specifically, the second inorganic barrier layer 320 is formed via plasma enhanced chemical vapor deposition in the step S6.

Specifically, an area covered by the second inorganic barrier layer 320 is the same as the area covered by the first inorganic barrier layer 310.

Specifically, the second inorganic barrier layer 320 includes silicon nitride, silicon oxide, or silicon oxynitride.

It should be noted that, the embodiments of the disclosure provide a method of encapsulating a flexible OLED panel. The method of encapsulating a flexible OLED panel includes: forming the liquid metal layer 400 on the first inorganic barrier layer covering 310 the OLED device 200; using oxygen to oxidize the liquid metal layer 400, and forming the liquid metal oxide layer 500 on a surface of the liquid metal layer 400; and sequentially forming the organic buffer layer 600 and the second inorganic barrier layer 320 on the liquid metal oxide layer 500 to obtain the encapsulation structure. The first inorganic barrier layer 310, the second inorganic barrier layer 320, the liquid metal layer 400 and the liquid metal oxide layer 500 could prevent penetration of water and oxygen, and the liquid metal layer and the organic buffer layer 600 could release the interlayer stress of the encapsulation structure in order to keep the flexibility of the encapsulation structure and enhance the capability of preventing penetration of water and oxygen, so the encapsulation effect of the flexible OLED panel could be improved.

Please refer to FIG. 7, the embodiment of the disclosure further provides an encapsulation structure of a flexible OLED panel. The encapsulation structure of a flexible OLED panel includes a TFT substrate 100, an OLED device 200 disposed on the TFT substrate 100, a first inorganic barrier layer 310 disposed on the TFT substrate 100 and covering the OLED device 200, a liquid metal layer 400 disposed on the first inorganic barrier layer 310, a liquid metal oxide layer 500 covering a surface of the liquid metal layer 400, an organic buffer layer 600 disposed on the first inorganic barrier layer 310 and covering the liquid metal oxide layer 500, and a second inorganic barrier layer 320 disposed on the first inorganic barrier layer 310 and covering the organic buffer layer 600.

Specifically, the size of an area covered by the liquid metal layer 400 is smaller than the size of an area covered by the first inorganic barrier layer 310, the size of an area covered by the organic buffer layer 600 is larger than the size of an area covered by the liquid metal oxide layer 500 and smaller than the size of the area covered by the first inorganic barrier layer 310, and an area covered by the second inorganic barrier layer 320 is the same as the area covered by the first inorganic barrier layer 310.

Specifically, the TFT substrate 100 includes a flexible TFT substrate.

Specifically, a material of the liquid metal layer 400 includes a binary eutectic alloy consisted of indium and gallium. The liquid metal layer 400 has a compact degree similar to the solid metal, so the capability of preventing penetration of water and oxygen is good. The state of the liquid metal layer 400 at room temperature is liquid, so the flexibility is good.

Selectively, a mass ratio of indium to gallium of the binary eutectic alloy is 1:3.

Specifically, the first inorganic barrier layer 310 and the second inorganic barrier layer 320 include silicon nitride ($SiN_x$), silicon oxide ($SiO_x$), or silicon oxynitride ($SiO_xN_y$).

It should be noted that, the embodiments of the disclosure provide an encapsulation structure of a flexible OLED panel. The encapsulation structure of a flexible OLED panel includes: the liquid metal layer 400 disposed on the first inorganic barrier layer covering 310 the OLED device 200; forming the liquid metal oxide layer 500 on a surface of the liquid metal layer 400; and the organic buffer layer 600 and the second inorganic barrier layer 320 sequentially disposed on the liquid metal oxide layer 500. The first inorganic barrier layer 310, the second inorganic barrier layer 320, the liquid metal layer 400 and the liquid metal oxide layer 500 could prevent penetration of water and oxygen, and the liquid metal layer and the organic buffer layer 600 could release the interlayer stress of the encapsulation structure in order to keep the flexibility of the encapsulation structure and enhance the capability of preventing penetration of water and oxygen, so the encapsulation effect of the flexible OLED panel could be improved.

In summary, the embodiments of the disclosure provide a method of encapsulating a flexible OLED panel and an encapsulation structure of a flexible OLED panel. The method of encapsulating a flexible OLED panel includes: forming a liquid metal layer on a first inorganic barrier layer covering the OLED device; using oxygen to oxidize the liquid metal layer, and forming a liquid metal oxide layer on a surface of the liquid metal layer; and sequentially forming an organic buffer layer and a second inorganic barrier layer on the liquid metal oxide layer to obtain an encapsulation structure. The first inorganic barrier layer, the second inorganic barrier layer, the liquid metal layer and the liquid metal oxide layer could prevent penetration of water and oxygen, and the liquid metal layer and the organic buffer layer could release the interlayer stress of the encapsulation structure in order to keep the flexibility of the encapsulation structure and enhance the capability of preventing penetration of water and oxygen, so the encapsulation effect of the flexible OLED panel could be improved.

The foregoing contents are detailed description of the disclosure in conjunction with specific preferred embodiments and concrete embodiments of the disclosure are not limited to this description. For the person skilled in the art of the disclosure, without departing from the concept of the disclosure, simple deductions or substitutions can be made and should be included in the protection scope of the application.

What is claimed is:

1. A method of encapsulating a flexible OLED panel, comprising the following steps:
    step S1: providing a TFT substrate, and manufacturing an OLED device on the TFT substrate;
    step S2: forming a first inorganic barrier layer covering the OLED device on the TFT substrate;
    step S3: forming a liquid metal layer on the first inorganic barrier layer;
    step S4: using oxygen to oxidize the liquid metal layer, and forming a liquid metal oxide layer on a surface of the liquid metal layer;
    step S5: forming an organic buffer layer covering the liquid metal oxide layer on the first inorganic barrier layer; and
    step S6: forming a second inorganic barrier layer covering the organic buffer layer on the first inorganic barrier layer.

2. The method of encapsulating a flexible OLED panel according to claim 1, wherein the TFT substrate includes a flexible TFT substrate.

3. The method of encapsulating a flexible OLED panel according to claim 1, wherein a material of the liquid metal layer includes a binary eutectic alloy consisted of indium and gallium.

4. The method of encapsulating a flexible OLED panel according to claim 3, wherein a mass ratio of indium to gallium of the binary eutectic alloy is 1:3.

5. The method of encapsulating a flexible OLED panel according to claim 1, wherein the first inorganic barrier layer is formed via plasma enhanced chemical vapor deposition in the step S2, the liquid metal layer is formed via ink jet printing in a nitrogen environment in the step S3, the organic buffer layer is formed via ink jet printing in the step S5 and further comprises a step of curing the organic buffer layer after the step S5, the second inorganic barrier layer is formed via plasma enhanced chemical vapor deposition in the step S6, an area covered by the second inorganic barrier layer is the same as an area covered by the first inorganic barrier layer, and the first inorganic barrier layer and the second inorganic barrier layer include silicon nitride, silicon oxide, or silicon oxynitride.

6. An encapsulation structure of a flexible OLED panel, comprising:
    a TFT substrate;
    an OLED device, disposed on the TFT substrate;
    a first inorganic barrier layer, disposed on the TFT substrate and covering the OLED device;
    a liquid metal layer, disposed on the first inorganic barrier layer;
    a liquid metal oxide layer, covering a surface of the liquid metal layer;
    an organic buffer layer, disposed on the first inorganic barrier layer and covering the liquid metal oxide layer; and
    a second inorganic barrier layer, disposed on the first inorganic barrier layer and covering the organic buffer layer.

7. The encapsulation structure of a flexible OLED panel according to claim 6, wherein the TFT substrate includes a flexible TFT substrate.

8. The encapsulation structure of a flexible OLED panel according to claim 6, wherein a material of the liquid metal layer includes a binary eutectic alloy consisted of indium and gallium.

9. The encapsulation structure of a flexible OLED panel according to claim 8, wherein a mass ratio of indium to gallium of the binary eutectic alloy is 1:3.

10. The encapsulation structure of a flexible OLED panel according to claim 6, wherein an area covered by the second inorganic barrier layer is the same as an area covered by the first inorganic barrier layer, and the first inorganic barrier layer and the second inorganic barrier layer include silicon nitride, silicon oxide, or silicon oxynitride.

11. A method of encapsulating a flexible OLED panel, comprising the following steps:
    step S1: providing a TFT substrate, and manufacturing an OLED device on the TFT substrate;
    step S2: forming a first inorganic barrier layer covering the OLED device on the TFT substrate;
    step S3: forming a liquid metal layer on the first inorganic barrier layer,
    step S4: using oxygen to oxidize the liquid metal layer, and forming a liquid metal oxide layer on a surface of the liquid metal layer;
    step S5: forming an organic buffer layer covering the liquid metal oxide layer on the first inorganic barrier layer; and
    step S6: forming a second inorganic barrier layer covering the organic buffer layer on the first inorganic barrier layer;
    wherein the TFT substrate includes a flexible TFT substrate;
    wherein a material of the liquid metal layer includes a binary eutectic alloy consisted of indium and gallium;
    wherein a mass ratio of indium to gallium of the binary eutectic alloy is 1:3; and
    wherein the first inorganic barrier layer is formed via plasma enhanced chemical vapor deposition in the step S2, the liquid metal layer is formed via ink jet printing in a nitrogen environment in the step S3, the organic buffer layer is formed via ink jet printing in the step S5 and further comprises a step of curing the organic buffer layer after the step S5, the second inorganic barrier layer is formed via plasma enhanced chemical vapor deposition in the step S6, an area covered by the second inorganic barrier layer is the same as an area covered by the first inorganic barrier layer, and the first inorganic barrier layer and the second inorganic barrier layer include silicon nitride, silicon oxide, or silicon oxynitride.

* * * * *